United States Patent
Yang et al.

(10) Patent No.: US 7,026,843 B1
(45) Date of Patent: Apr. 11, 2006

(54) FLEXIBLE CASCODE AMPLIFIER CIRCUIT WITH HIGH GAIN FOR FLASH MEMORY CELLS

(75) Inventors: Tien-Chun Yang, San Jose, CA (US); Pau-Ling Chen, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/759,855

(22) Filed: Jan. 16, 2004

(51) Int. Cl.
*G01R 19/00* (2006.01)

(52) U.S. Cl. ............... 327/51; 327/55; 365/185.07
(58) Field of Classification Search ............ 327/51–57; 365/185.07, 189.07
See application file for complete search history.

(56) References Cited

U.S. PATENT DOCUMENTS

| | | | | |
|---|---|---|---|---|
| 5,672,995 A | * | 9/1997 | Hirase et al. | 327/534 |
| 5,801,576 A | * | 9/1998 | Ooishi | 327/530 |
| 5,847,583 A | * | 12/1998 | Matsubara | 327/51 |
| 5,880,604 A | * | 3/1999 | Kawahara et al. | 326/83 |
| 6,107,869 A | * | 8/2000 | Horiguchi et al. | 327/544 |
| 6,246,280 B1 | * | 6/2001 | Morishita | 327/535 |
| 6,323,724 B1 | * | 11/2001 | Uekubo | 327/538 |
| 6,417,722 B1 | * | 7/2002 | Schneider et al. | 327/534 |
| 6,445,222 B1 | * | 9/2002 | Hidaka et al. | 327/108 |
| 6,483,374 B1 | * | 11/2002 | Mizuno et al. | 327/534 |
| 6,535,026 B1 | * | 3/2003 | Chung et al. | 327/51 |
| 6,600,360 B1 | * | 7/2003 | Mizuno et al. | 327/534 |
| 6,603,345 B1 | * | 8/2003 | Takahashi | 327/534 |
| 6,650,147 B1 | * | 11/2003 | Conte et al. | 327/51 |
| 6,777,986 B1 | * | 8/2004 | Hidaka et al. | 327/108 |

* cited by examiner

*Primary Examiner*—Kenneth B. Wells
(74) *Attorney, Agent, or Firm*—Farjami & Farjami LLP

(57) ABSTRACT

An exemplary cascode amplifier circuit comprises a first intrinsic FET, a second intrinsic FET, a third intrinsic FET, and a fourth FET. The first intrinsic FET has a source connected to a target memory cell via a bit line and a drain connected to a first node. The second intrinsic FET has a gate connected to the source of the first intrinsic FET and a source connected to a reference voltage. The second intrinsic FET also has a drain connected at a second node to a gate of the first intrinsic FET. The third intrinsic FET has a source connected to the first node and a gate connected to a supply voltage, and further provides a load across the supply voltage and the first node. The fourth FET has a source connected to the second node and a drain connected to the supply voltage, the fourth FET having a gate connected to an input control voltage.

3 Claims, 4 Drawing Sheets

FLEXIBLE CASCODE AMPLIFIER CIRCUIT WITH HIGH GAIN FOR FLASH MEMORY CELLS

1. TECHNICAL FIELD

The present invention relates generally to the field of semiconductor devices. More particularly, the present invention relates to semiconductor memory devices.

2. BACKGROUND ART

Memory devices are known in the art for storing data in a wide variety of electronic devices and applications. A typical flash memory device comprises a number of memory cells. Often, memory cells are arranged in an array format, where a row of memory cells corresponds to a word line and a column of memory cells corresponds to a bit line, and where each memory cell defines a binary bit, i.e., either a zero ("0") bit or a one ("1") bit.

Typically, the state of a memory cell is determined during a read operation by sensing the current drawn by the memory cell. According to one particular embodiment, the current drawn by a particular memory cell (also referred to as "target memory cell" or "core memory cell") is ascertained by connecting the drain terminal of the memory cell to a sensing circuit, where the source terminal of the memory cell is connected to ground, and the gate of the memory cell is selected. The sensing circuit attempts to detect the current drawn by the memory cell (also referred to as "target memory cell current" or "core cell current"), and compares the sensed memory cell current against a reference current. If the sensed memory cell current exceeds the reference current, the memory cell is considered an erased cell, e.g., corresponding to a "1" bit. However, if the sensed memory cell current is below the reference current, the memory cell is considered a programmed cell, e.g., corresponding to a "0" bit.

Cascode amplifiers are known in the art for converting current to voltage. Current to voltage conversion is particularly useful when a comparison between a first current, such as that drawn by a target memory cell, and a second current, such as that drawn by a reference memory cell, is required. The reason is that voltage comparators, such as operational amplifiers, for example, are readily available for comparing two voltage values. Accordingly, the conventional approach in comparing two current values involves first converting the current values to voltage values, and then comparing the voltage values using an operational amplifier or other voltage comparator. In this way, during a read operation involving a target memory cell, a conventional cascode amplifier supplies a bit line voltage to the drain of the target memory cell, and generates a sense amp input voltage which corresponds to the current drawn by the target memory cell. Similarly, a sense amp reference voltage can be ascertained corresponding to the current drawn by a reference memory cell, and the sense amp input voltage and the sense amp reference voltage can be compared to determine the state of the target memory cell.

Known cascode amplifiers, however, suffer from a number of problems, which negatively impact the performance of flash memory devices. Typically, conventional cascode amplifiers produce a relatively low DC gain (from the bit line voltage to the sense amp input voltage), particularly at low current, e.g., when a programmed target memory cell draws low current. As a result, the signal generated at the sense amp input voltage is considerably limited, and, thus, accuracy in identifying the state of the target memory cell is negatively impacted, and read operations of the flash memory device are degraded. Furthermore, the bit line voltage supplied to the drain of the target memory cell achieved by conventional cascode amplifiers have a limited range and, therefore, cannot be flexibly used for various types of memory cells that require a drain voltage outside of the limited range provided by conventional cascode amplifiers.

Accordingly, there exists a strong need in the art to overcome deficiencies of known cascode amplifier circuits, such as those described above, and to provide a flexible cascode amplifier circuit with high gain for flash memory devices.

SUMMARY

The present invention addresses and resolves the need in the art for a flexible cascode amplifier circuit with high gain for flash memory devices. During a read operation involving a target memory cell, the cascode amplifier circuit is connected to the target memory cell via a bit line, typically by a selection circuit. According to one exemplary embodiment, the cascode amplifier circuit comprises a first intrinsic FET, a second intrinsic FET, a third intrinsic FET, and a fourth FET. The first intrinsic FET has a source connected to the bit line and a drain connected to a first node. The second intrinsic FET has a gate connected to the source of the first intrinsic FET and a source connected to a reference voltage, such as ground. The second intrinsic FET also has a drain connected at a second node to a gate of the first intrinsic FET. The third intrinsic FET has a source connected to the first node and a gate connected to a supply voltage, and further provides a load across the supply voltage and the first node. The fourth FET has a source connected to the second node and a drain connected to the supply voltage, the fourth FET having a gate connected to an input control voltage. With this arrangement, a bit line voltage having a wide range is generated at the source of the first intrinsic FET, and a sense amp input voltage with high gain is generated at the first node.

According to another embodiment of the invention, the second intrinsic FET operates in the saturation region. In one particular embodiment, the second intrinsic FET has a gate width to gate length ratio of approximately 6/0.9. According to another embodiment, the cascode amplifier circuit is activated by first and second enable transistors. For example, according one particular embodiment the third intrinsic FET has a drain connected to the supply voltage through a first enable transistor, the fourth FET having a drain connected to the supply voltage through a second enable transistor.

Other features and advantages of the present invention will become more readily apparent to those of ordinary skill in the art after reviewing the following detailed description and accompanying drawings.

DETAILED DESCRIPTION OF THE INVENTION

The present invention is directed to a flexible cascode amplifier circuit with high gain for flash memory devices. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
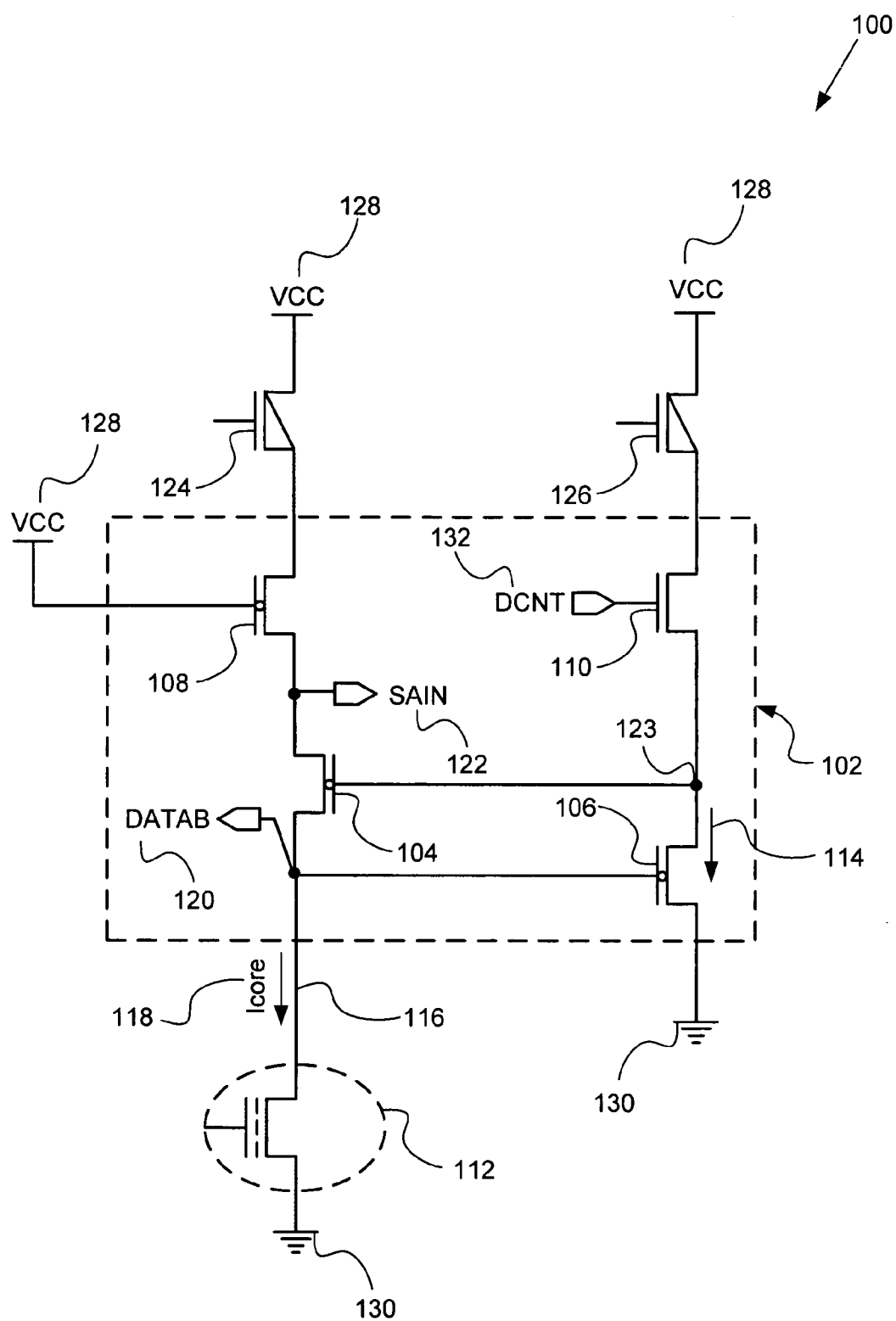
FIG. 1 depicts a circuit diagram of an exemplary cascode amplifier circuit according to one embodiment of the present invention.

Referring to FIG. 1, there is shown a circuit diagram of exemplary cascode amplifier circuit 102 according to one embodiment of the present invention. Cascode amplifier circuit 102 may be part of larger circuit arrangement 100 which itself may be part of a flash memory device.

In FIG. 1, cascode amplifier circuit 102 supplies bit line voltage ("DATAB") 120 to the drain of target memory cell 112 via bit line 116 during a read operation involving target memory cell 112, and generates sense amp input voltage ("SAIN") 122 corresponding to target memory cell current 118 (also referred to as "core cell current 118" and "Icore 118") drawn by target memory cell 112 during the read operation. As discussed below, cascode amplifier circuit 102 provides higher DC gain at 122, resulting in significantly improved read operations involving target memory cell 112. Also discussed below, cascode amplifier circuit 102 provides a wider voltage range via DATAB 120, thereby allowing cascode amplifier circuit 102 to be flexibly used for a variety of flash memory cells, including memory cells capable of storing a single bit and memory cells capable of storing two independent bits in separate locations within the memory cell, such as Advanced Micro Devices, Inc. (AMD) MirrorBit™ memory devices, for example.

As shown in FIG. 1, cascode amplifier circuit 102 comprises FETs 104, 106, 108, and 110, where the source of FET 104 at node 120 is connected to the drain of target memory cell 112, typically by a selection circuit (not shown), through bit line 116 during a read operation involving target memory cell 112. During the read operation, the source of target memory cell 112 is also connected to a reference voltage, such as ground 130, and the gate of target memory cell 112 is selected to turn on target memory cell 112, which draws Icore 118 via bit line 116. PFET 124 and PFET 126 operate as enable transistors to switch on cascode amplifier circuit 102 during a read operation involving target memory cell 112. More specifically, PFET 124 is enabled to connect supply voltage ("VCC") 128 to the drain of FET 108, PFET 126 is enabled to connect VCC 128 to the drain of PFET 110.

In accordance with one embodiment of the invention, FETs 104, 106 and 108 comprise intrinsic NFETs each having a threshold voltage ("Vt") in the range of approximately 0.3 to 0.5 V, and FET 110 comprises an NFET having a Vt in the range of approximately 0.7 to 1 V. By way of example, FET 104 has a gate width to length ratio ("W/L") of approximately 45/0.9, FET 106 has a W/L of approximately 6/0.9, FET 108 has a W/L of approximately 4/8, and FET 110 has a W/L of approximately 6/1. As shown in FIG. 1, the source of FET 104 is connected to node 120 and a drain connected to node 122. FET 106 has a gate connected to the source of FET 104 at node 120, and a drain connected to a gate of FET 104 at node 123. FET 106 further has a source connected to a reference voltage, such as ground 130. FET 108 has a gate connected to VCC 128, a drain connected to VCC 128 through enable PFET 124, and a source connected to node 122. FET 110 has a drain connected to VCC 128 through enable PFET 126 and a source coupled to node 123. Control voltage ("DCNT") 132 is supplied to the gate of FET 110.

Figure 2:
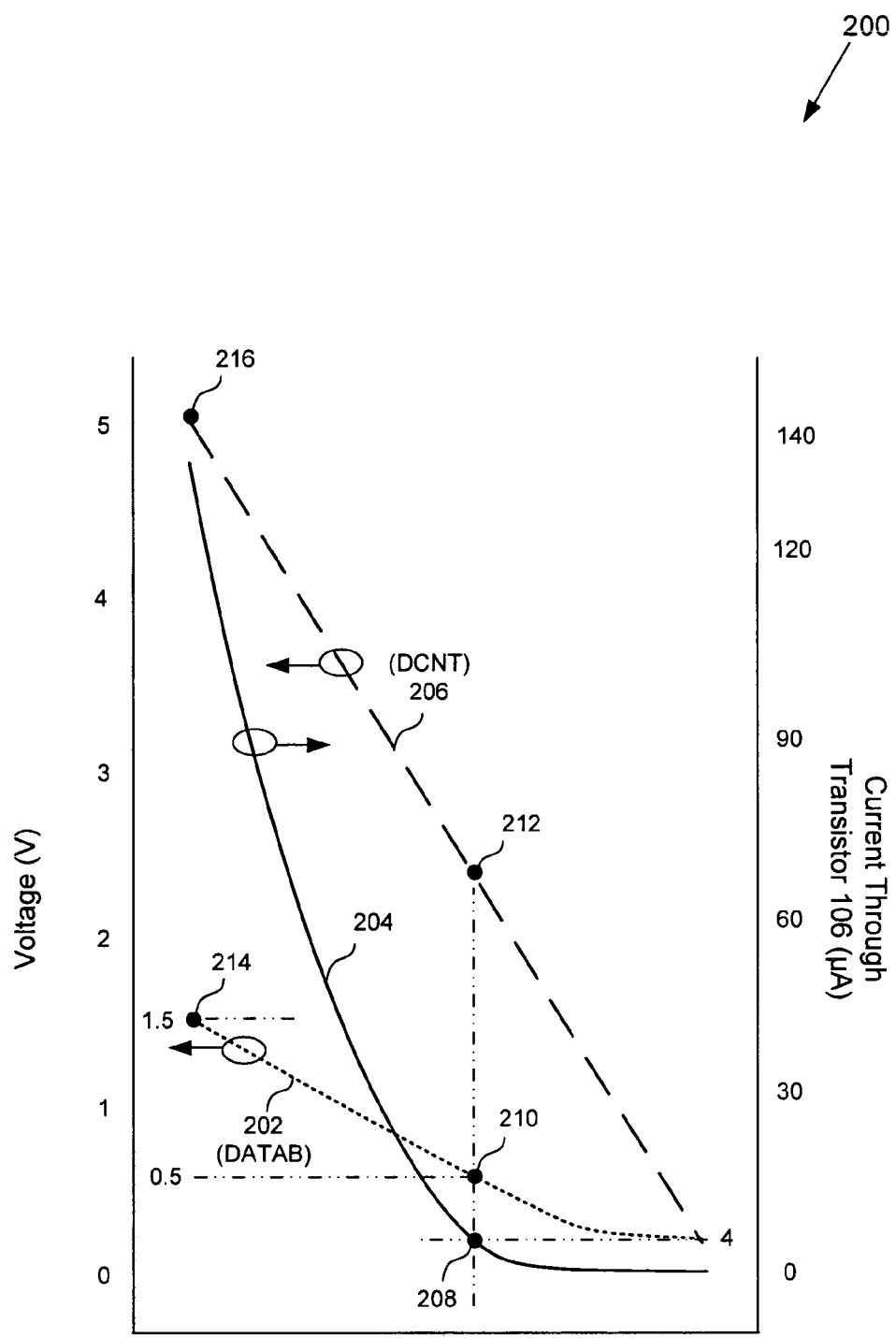
FIG. 2 depicts a graph illustrating the bit line voltage as a function of the control voltage achieved according to an exemplary cascode amplifier circuit according to one embodiment of the present invention.

In cascode amplifier circuit 102, FET 104 operates as a primary cascode transistor, FETs 106 and 110 operate as a negative feedback to FET 104 for stabilizing DATAB 120, and FET 108 operates as a load across VCC 128 and the drain of FET 104. With this arrangement, cascode amplifier circuit 102 generates DATAB 120, which has a lower operating bound and a wider range to accommodate numerous memory cell types. For example, with reference to FIG. 2, graph 200 illustrates DATAB 120 and current 114 drawn by FET 106 as a function of DCNT 132 sweeping from 5V to 0V, as achieved by cascode amplifier circuit 102. In FIG. 2, DATAB curve 202 corresponds to DATAB 120, current curve 204 corresponds to current 114 drawn by FET 106 when cascode amplifier circuit 102 is activated, and DCNT curve 206 corresponds to DCNT 132 supplied to the gate of FET 110. As shown in graph 200, when current curve 204 approaches the lower bound of approximately 4 micro Amps (µA) at point 208, cascode amplifier circuit 102 is operating and generates DATAB 120 of approximately 0.5V (corresponding to DATAB curve 202 at point 210). Thus, with DCNT 132 of approximately 2.5V (corresponding to DCNT curve 206 at point 212), cascode amplifier circuit 102 is operating, and DATAB 120 has a voltage of approximately 0.5V, which is suitable for use with target memory cell 112 capable of storing a single bit. Continuing with graph 200, with DCNT 132 of approximately 5V (corresponding to DCNT curve 206 at point 216), DATAB 120 has a voltage of approximately 1.5V (corresponding to DATAB curve 202 at point 214), which is suitable for use with target memory cell 112 capable of storing two binary bits. As illustrated by the above examples, due to the particular arrangement of cascode amplifier circuit 102, the flexible and wide voltage range for DATAB 120 achieved by cascode amplifier circuit 102 allows cascode amplifier circuit 102 to be used with a wide variety of memory cells.

Figure 3:
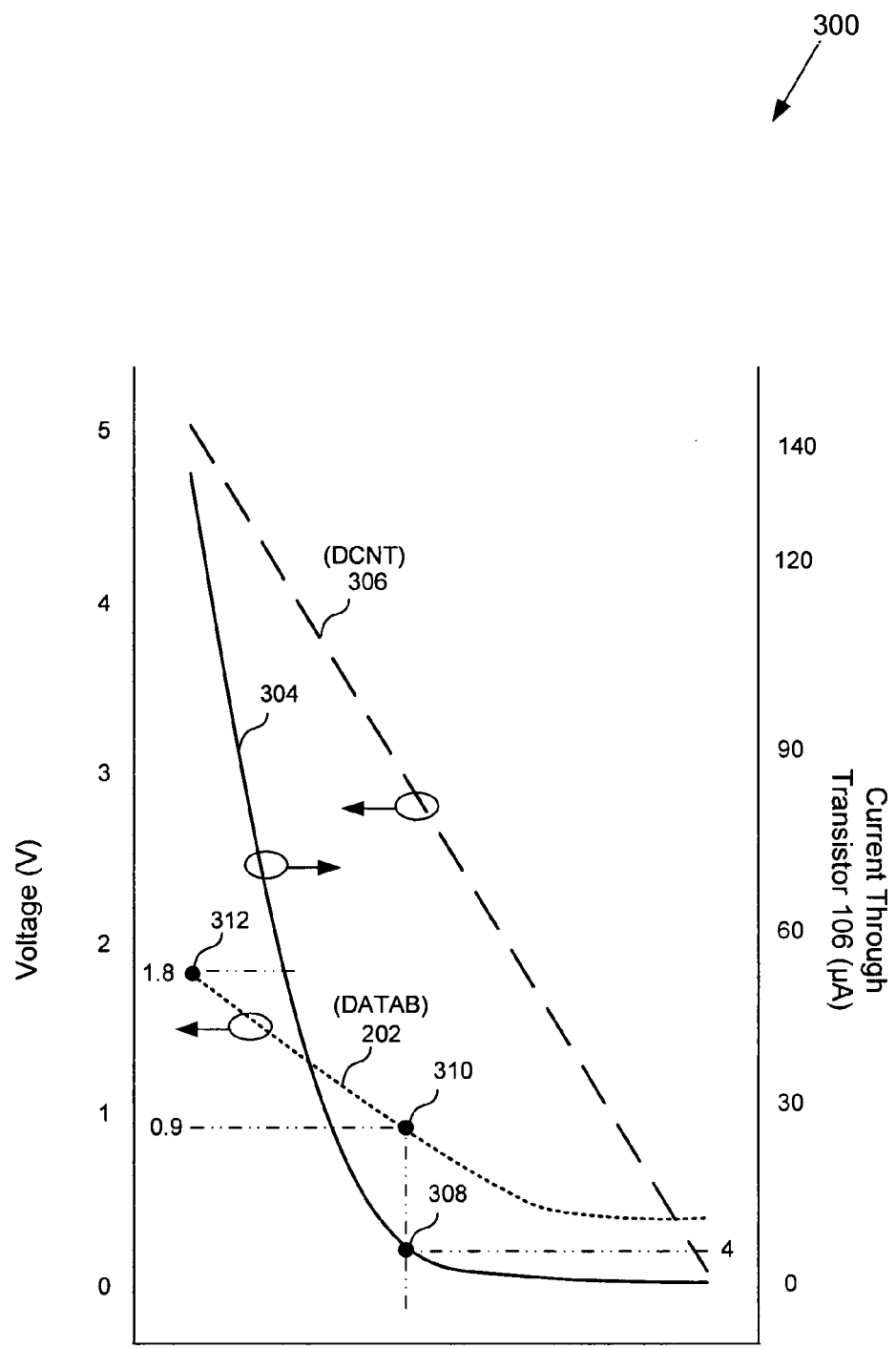
FIG. 3 depicts a graph illustrating the bit line voltage as a function of the control voltage achieved according to a conventional cascode amplifier circuit.

In contrast, conventional cascode amplifier circuits have a limited bit line voltage range. For example, with reference to FIG. 3, graph 300 illustrates the DATAB voltage as a function of the DCNT voltage input achieved by a conventional cascode amplifier circuit. In FIG. 3, DATAB curve 302 corresponds to the bit line voltage supplied to a target memory cell, current curve 304 corresponds to the current drawn by a conventional transistor that replaces FET 106 in FIG. 1, and DCNT curve 306 corresponds to the control current voltage supplied to the conventional cascode amplifier circuit. As shown in graph 300, when current curve 304 approaches the lower bound of approximately 4 µA at point 308, the conventional cascode amplifier circuit generates a bit line voltage of approximately 0.9V (corresponding to DATAB curve 302 at point 310). Continuing with graph 300, the upper bound of DATAB curve 302 at point 312 corresponds to a bit line voltage of approximately 1.8V, and thus, the bit line voltage range achieved by the conventional cascode amplifier circuit has a significantly limited range of approximately 0.9V to 1.8V, which severely limits the flexibility of such conventional cascode amplifier circuits to be used with a wide variety of memory cells.

Figure 4:
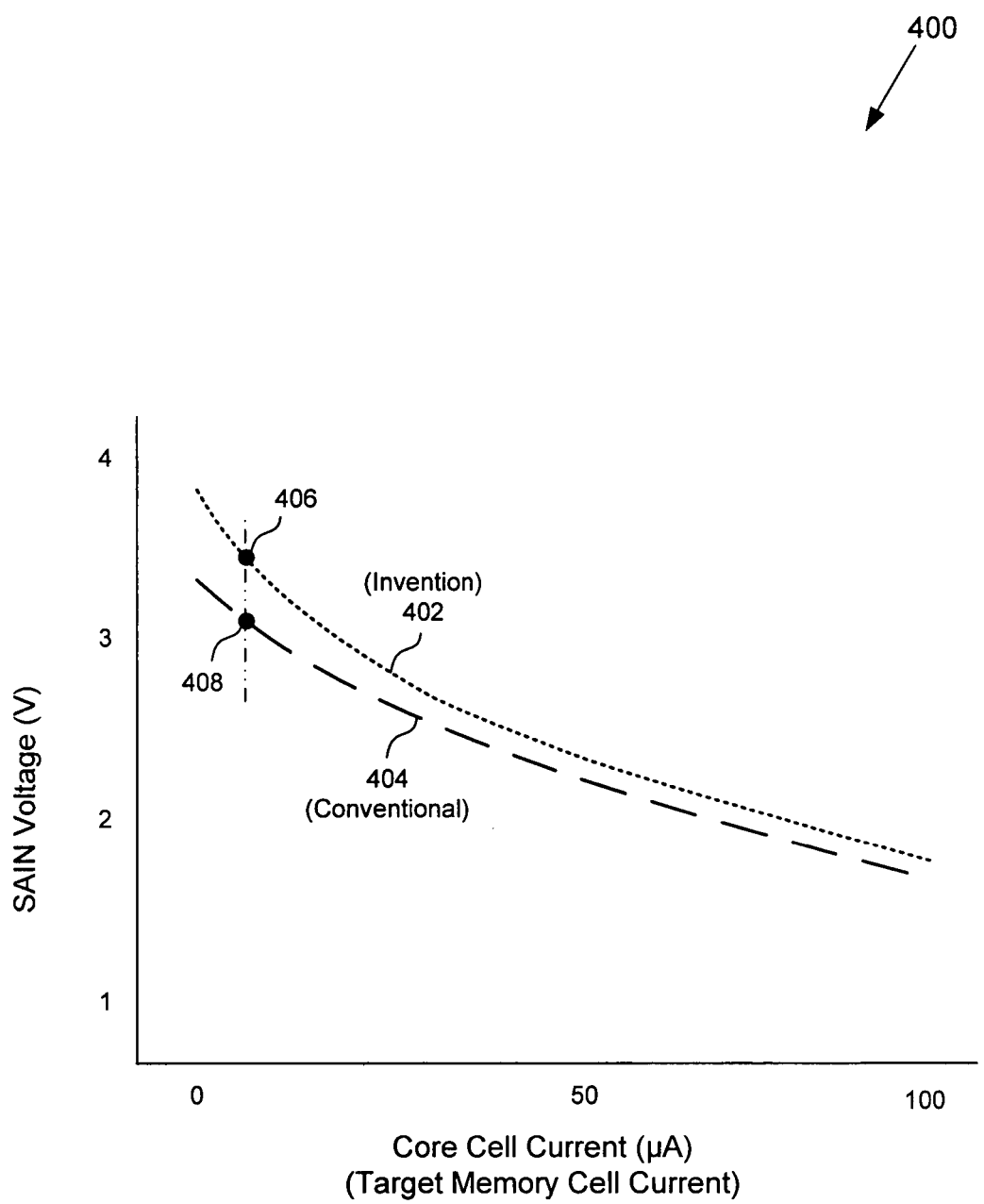
FIG. 4 depicts a graph comparatively illustrating the gain achieved by an exemplary cascode amplifier circuit according to one embodiment of the present invention and the gain achieved by a conventional cascode amplifier circuit.

Continuing with FIG. 1, cascode amplifier circuit 102 generates SAIN 122 corresponding to Icore 118 drawn by target memory cell 112 during a read operation involving target memory cell 112. Due to the particular arrangement of cascode amplifier circuit 102, a significantly higher DC gain is achieved at SAIN 122, while achieving a lower operating voltage at DATAB 120 as discussed above. High DC gain at SAIN 122 is achieved due to the low Vt of FET 106 and due to the large size (W/L) of FET. Thus, even at a low voltage of approximately 0.5V at DATAB 120, which is supplied to the gate of FET 106, FET 106 is capable of operating in the saturation region, and current through FET 106 and FET 110 will not be shut off. Thus, cascode amplifier circuit 102 continues to operate, generating DATAB 120 and SAIN 122. As a benefit, high DC gain 122 is achieved at SAIN 122. With reference to FIG. 4, graph 400 illustrates the curves 402 and 404, which correspond respectively the gain achieved by cascode amplifier circuit 102 and a conventional cascode amplifier circuit, where the vertical axis defines SAIN voltage and the horizontal axis defines the current through the target memory cell, i.e., core cell current. In graph 400, curve 402 corresponds to the gain achieved by cascode amplifier circuit 102 of FIG. 1 and curve 404 corresponds to the gain achieved by a conventional cascode amplifier circuit. As shown in graph 400, curve 402 has significantly steeper slope (corresponding to higher gain) over curve 404, particularly at low current. For example, at point 406, curve 402 has a gain of approximately 0.042 V/µA in comparison to curve 404, which has a gain of approximately 0.03 V/µA at point 408.

In sum, cascode amplifier circuit 102 provides increased gain at SAIN 122, which improves the accuracy of read operations involving target memory cell 112, thereby improving the reliability of the flash memory device. Furthermore, due to the particular arrangement of cascode amplifier circuit 102, a wide voltage range for DATAB 120 is achieved, which allows cascode amplifier circuit 102 to be used with a variety of memory cells.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the particular operating voltages or voltage ranges referred to in the present application can be modified without departing from the scope of the present invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a flexible cascode amplifier circuit with high gain for flash memory devices has been described.

What is claimed is:

1. A cascode amplifier circuit, said cascode amplifier circuit being connected to a target memory cell via a bit line during a read operation involving said target memory cell, said cascode amplifier circuit comprising:

a first intrinsic FET having a source connected to said bit line and a drain connected to a first node, a bit line voltage being generated at said source of said first intrinsic FET, a sense amp input voltage being generated at said first node;

a second intrinsic FET having a gate connected to said source of said first intrinsic FET and a source connected to a reference voltage, said second intrinsic FET having a drain connected at a second node to a gate of said first intrinsic FET;

a third intrinsic FET having a source connected to said first node and a gate connected to a supply voltage, said third intrinsic FET further providing a load across said supply voltage and said first node;

a fourth FET having a source connected to said second node and a drain connected to said supply voltage, said fourth FET having a gate connected to an input control voltage; wherein said third intrinsic FET has a drain connected to said supply voltage through a first enable transistor, and wherein said fourth FET has a drain connected to said supply voltage through a second enable transistor.

2. A cascode amplifier circuit, said cascode amplifier circuit being connected to a target memory cell via a bit line during a read operation involving said target memory cell, said cascode amplifier circuit comprising:

means for receiving an input control voltage comprising an NFET, said NFET having a drain connected to a supply voltage and a gate connected to said input control voltage;

means for generating a bit line voltage responsive to said control voltage comprising a first intrinsic FET, said first intrinsic FET having a source connected to said bit line and a drain connected to a first node, said bit line voltage being generated at said source of said first intrinsic FET, a sense amp input voltage being generated at said first node;

means for generating a negative feedback voltage at a second node responsive to said bit line voltage comprising a second intrinsic FET, said second intrinsic FET having a gate connected to said source of said first intrinsic FET and a source connected to a reference voltage, said second intrinsic FET having a drain connected at said second node to a gate of said first intrinsic FET and to a source of said NFET;

means for generating a load across said supply voltage and said first node comprising a third intrinsic FET, said third intrinsic FET having a source connected to said first node and a gate connected to said supply voltage; wherein said third intrinsic FET has a drain connected to said supply voltage through a first enable transistor, and wherein said NFET has a drain connected to said supply voltage through a second enable transistor.

3. A cascode amplifier circuit, said cascode amplifier circuit being connected to a target memory cell via a bit line during a read operation involving said target memory cell, said cascode amplifier circuit including a first intrinsic FET having a source connected to said bit line and a drain connected to a first node, a bit line voltage being generated at said source of said first intrinsic FET, a sense amp input voltage being generated at said first node, said cascode amplifier circuit being characterized by:

a second intrinsic FET having a gate connected to said source of said first intrinsic FET and a source connected to a reference voltage, said second intrinsic FET having a drain connected at a second node to a gate of said first intrinsic FET; a third intrinsic FET having a source connected to said first node and a gate connected to a supply voltage, said third intrinsic FET further providing a load across said supply voltage and said first node; a fourth FET having a source connected to said second node and a drain connected to said supply voltage, said fourth FET having a gate connected to an input control voltage; wherein said third intrinsic FET has a drain connected to said supply voltage through a first enable transistor, and wherein said fourth FET has a drain connected to said supply voltage through a second enable transistor.

* * * * *